United States Patent [19]
Chu et al.

[11] Patent Number: 5,945,870
[45] Date of Patent: Aug. 31, 1999

[54] VOLTAGE RAMP RATE CONTROL CIRCUIT

[75] Inventors: Michael H. Chu, Fremont; Gwen G. Liang, Mountain View; Myron W. Wong; John Costello, both of San Jose; John Turner, Santa Cruz, all of Calif.

[73] Assignee: Altera Corporation, San Jose, Calif.

[21] Appl. No.: 08/783,751

[22] Filed: Jan. 16, 1997

Related U.S. Application Data

[60] Provisional application No. 60/022,130, Jul. 18, 1996.

[51] Int. Cl.$^6$ ................................ H03B 5/24; G05F 3/16
[52] U.S. Cl. ..................... 327/536; 327/538; 327/540; 327/172; 331/57
[58] Field of Search ..................................... 327/170, 536, 327/537, 131, 390, 172, 291, 140, 540; 331/57

[56] References Cited

U.S. PATENT DOCUMENTS

| | | |
|---|---|---|
| 4,366,396 | 12/1982 | Rosler et al. ............................. 327/309 |
| 4,547,682 | 10/1985 | Bialas et al. ............................. 327/536 |
| 5,041,739 | 8/1991 | Goto ........................................ 327/536 |
| 5,168,174 | 12/1992 | Naso et al. ............................... 327/540 |
| 5,389,998 | 2/1995 | Taketoshi et al. .......................... 331/2 |
| 5,585,765 | 12/1996 | O'Shaughnessy ....................... 327/541 |

*Primary Examiner*—Dinh T. Le
*Attorney, Agent, or Firm*—Townsend and Townsend and Crew LLP

[57] ABSTRACT

Various embodiments for controlling a ramp rate of a high voltage generator circuit such as a charge pump circuit are disclosed. In one embodiment the ramp rate of the output signal is controlled by modulating an amplitude of the oscillating signal at the input of the charge pump circuit. In another embodiment, the ramp rate is controlled by modulating the current loading at the output of the charge pump circuit. In yet another embodiment, the ramp rate of the output signal is controlled by modulating the frequency of the oscillating signal at the input of the charge pump circuit.

20 Claims, 7 Drawing Sheets

VOLTAGE RAMP RATE CONTROL CIRCUIT

This application claims the benefit of U.S. Provisional Application No. 60/022,130, filed Jul. 18 1996, the disclosure of which is incorporated by reference.

BACKGROUND OF THE INVENTION

The present invention relates in general to high voltage generator circuitry, and in particular to various circuit techniques for controlling the ramp rate and amplitude of the output voltage of a charge pump circuit.

In certain types of semiconductor devices such as non-volatile memories, voltage levels higher than the power supply voltage are required. For example, in electrically erasable programmable read only memories (EEPROMs), memory cells are programmed or erased by a mechanism known as Fowler-Nordheim tunneling (FNT). FNT occurs when high enough voltages are applied across the tunnel oxide of the memory cell to generate the necessary electric field (E-field) to induce charge to cross the tunnel. Charge pump techniques are typically used to internally generate the higher programming voltage (VPP) from the regular power supply voltage.

Conventional charge pump circuits generate VPP at a relatively fast rate, resulting in larger E-fields across the tunnel oxide. The tunnel oxide, which is typically made up of a thin layer of silicon dioxide, tends to degrade over time as it undergoes repeated electron tunneling. The degradation is cumulative and is generally proportional to the E-field experienced by the oxide at each tunneling event. A charge pump circuit with fast VPP ramp rate, therefore, subjects the tunnel oxide to larger E-fields for a longer period throughout the duration of each tunneling event. The resulting damage to the tunnel oxide over time causes reliability problems and shortens the life of the product. This problem is exacerbated as processing dimensions are shrunk and tunnels oxides are made thinner.

There is therefore a need for high voltage generator circuits with well controlled ramp rates.

SUMMARY OF THE INVENTION

The present invention provides various embodiments for controlling the ramp rate of the output voltage of a high voltage generator circuit. A slower, more gradual increase in the amplitude of, for example, the programming voltage for an EEPROM cell, reduces the E-field across the tunnel oxide of the memory cell. This in turn results in a gradual transfer of charge through the tunnel oxide before the continued application of higher voltages. By keeping the E-field across the tunnel oxide below the values which cause degradation throughout the duration of a tunneling event, the life time of the memory cell is significantly increased.

Accordingly, in one embodiment, the present invention provides a voltage generator control circuit which includes an amplitude modulation circuit having an input for receiving an oscillating signal, and an output coupled to a charge pump circuit, whereby, the ramp rate of the voltage at an output of the charge pump circuit is controlled by modulating an amplitude of the oscillating signal. The amplitude modulation circuit includes a variable voltage reference generator having an output coupled to a modulator, and a timing control circuit coupled to the variable voltage reference generator. The timing control circuit switchably couples gradually increasing reference voltages to the modulator resulting in a gradually increasing voltage at the output of the charge pump circuit.

In another embodiment, the present invention provides a voltage generator control circuit which includes a charge pump circuit having an input for receiving an oscillating signal, and a variable current loading circuit coupled to an output of the charge pump circuit, whereby, the ramp rate of the voltage at the output of the charge pump circuit is controlled by varying the current loading at the output. The variable current loading circuit includes multiple current source devices connected in parallel at the output of the charge pump circuit. The variable current loading circuit further includes a timing control circuit that controls the state of each current source device. The variable current loading circuit gradually decreases the current loading by sequentially turning off the current source devices. By adjusting the size of each current decrement and the time interval, the ramp rate of the charge pump circuit output is controlled.

In yet another embodiment, the present invention provides a voltage generator control circuit which includes a variable frequency oscillator having an output coupled to an input of a charge pump circuit, whereby, the ramp rate of the voltage at the output of the charge pump circuit is controlled by varying the frequency of the oscillator. The variable frequency oscillator includes a ring oscillator coupled to a frequency modulation circuit, and a timing control circuit coupled to the frequency modulation circuit. In response to the timing control circuit, the frequency modulation circuit controls the length of the ring oscillator to gradually increase the oscillating frequency. As the oscillating frequency increases, the amplitude of the voltage at the output of the charge pump circuit increases.

A better understanding of the nature and advantages of the various embodiments of the present invention may be had with reference to the detailed descriptions and the drawings below.

DESCRIPTION OF SPECIFIC EMBODIMENTS

In a typical charge pump circuit, the final value of the output voltage (VPP) is directly proportional to the amplitude of the oscillating signal driving the charge pump capacitors. In one embodiment, the present invention provides a method and circuitry for controlling the ramp rate of the charge pump output voltage VPP by modulating the amplitude of the oscillating signal.

Figure 1:
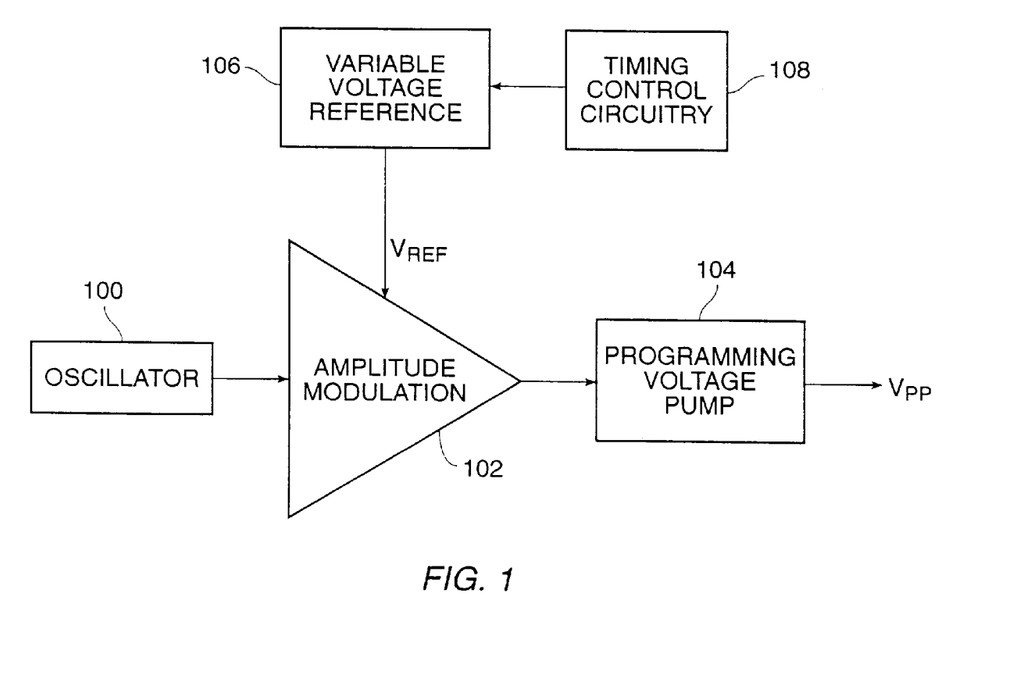
FIG. 1 is a block diagram of a high voltage generator circuit using an oscillator amplitude modulation technique to control the output ramp rate according to a first embodiment of the present invention.

Referring to FIG. 1, there is shown a block diagram of a high voltage generator circuit according to a first embodiment of the present invention. An oscillator 100 generates an oscillating signal whose amplitude is modulated by an amplitude modulation block 102. Amplitude modulation block 102 receives a reference voltage Vref from a variable voltage reference generator 106. Variable voltage reference generator operates in response to a timing control circuit 108. The output of amplitude modulation block 102 drives a charge pump circuit 104 to generate the high voltage signal VPP.

In operation, variable voltage reference generator 106 divides the power supply voltage into fine voltage increments that are made available on multiple taps. Each one of the reference voltage levels is switchably connected to the output node Vref. Starting from a minimum Vref level, the amplitude of the signal driving charge pump circuit 104 gradually increases as higher and higher reference voltage levels are switched to Vref. Timing control circuit 108 generates the signals that control the switching of the various reference voltage levels to Vref. Thus, by designing for adequately small Vref increments and controlling the timing of each increase in the modulation level, the final VPP value and VPP ramp rate can be precisely controlled. The circuit allows the user to design for a VPP ramp that increases linearly or with any desired shape.

Figure 2:
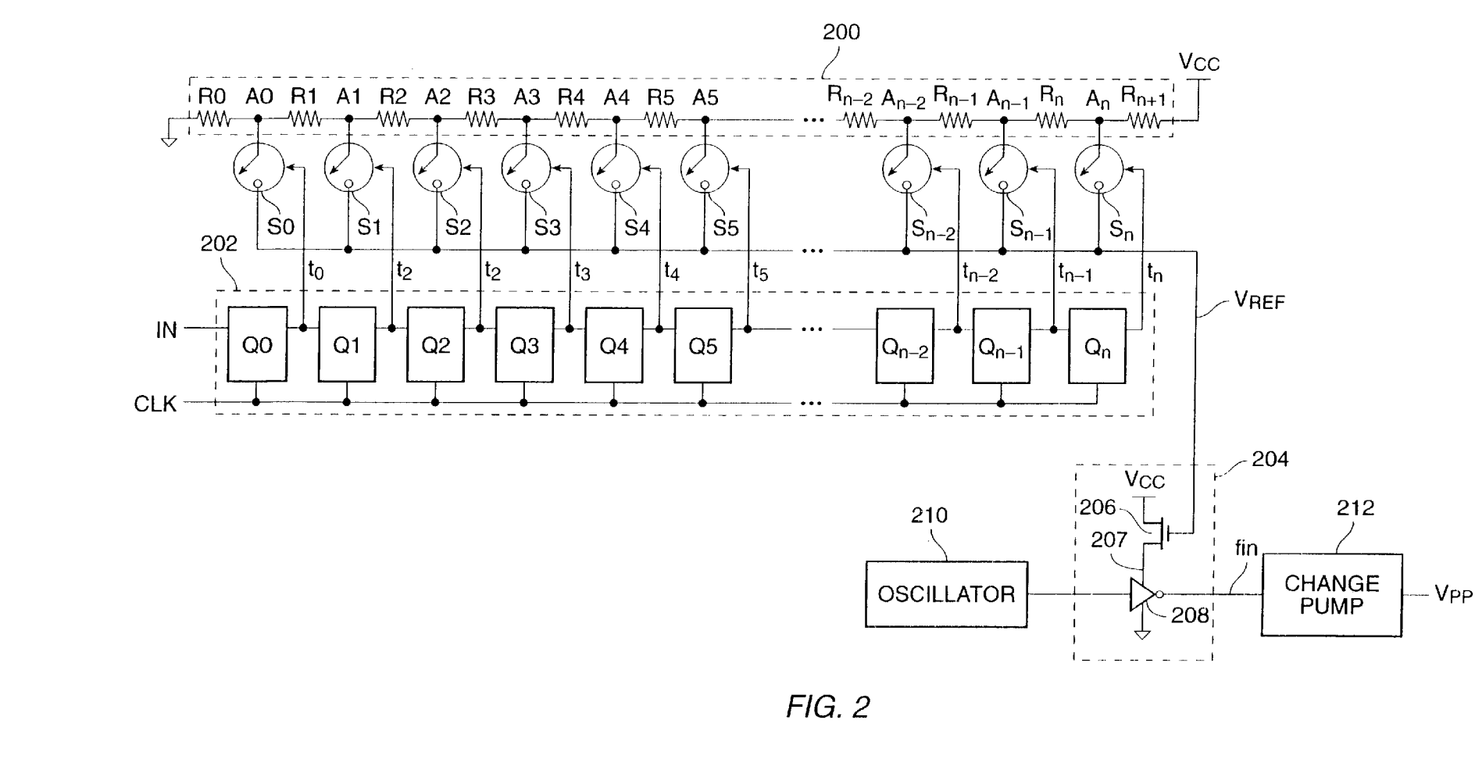
FIG. 2 is a simplified circuit schematic of an exemplary implementation of the high voltage generator circuit of FIG. 1.

A simplified example of a circuit implementation for the high voltage generator of FIG. 1 is shown in FIG. 2. A resistive voltage divider 200 includes resistors $R_0$ through $R_{n+1}$ that divide the power supply voltage Vcc into n+1 voltage levels $A_o$ through $A_n$. It is to be understood that there exist alternative means of generating multiple reference voltage levels to be used in the circuit of the present invention, and that the chain of resistors is only one example. Voltage levels $A_0$ through $A_n$ connect to a common node Vref through a bank of n+1 switches $S_0$ through $S_n$, respectively. A shift register 202 provides n+1 control signals $t_0$ to $t_n$ for switches $S_0$ through $S_n$, respectively. The common node Vref connects to an amplitude modulator 204 which includes a transistor 206 that supplies the positive power supply voltage Vcc to an inverter 208. Transistor 206 receives Vref at its gate terminal. The input of inverter 208 is driven by the output of an oscillator 210, and the output of inverter 208 drives the input of a charge pump circuit 212.

Resistors $R_0$ through $R_{+1}$ are preferably identical in size and layout to provide equal increments accurately. The value of the voltage increment will depend on the desired ramp rate. Resistor divider chain 200 may be designed to provide reference voltages at increments of, for example, 0.05 volts. Shift register 202 shifts a logic "1" from $Q_0$ to $Q_1$ in response to a clock signal Clk. As the logic "1" is passed through the various stages of shift register 202, control signals $t_0$ through $t_{n+1}$ sequentially close switches $S_0$ to $S_{n+1}$. Thus, the value of Vref starts at a low voltage level of $A_0$ and gradually increases in a staircase shape with, e.g., 0.05 volt steps, to $A_n$ and eventually to Vcc. Vref is applied to the gate terminal of transistor 206 whose source terminal supplies power to inverter 208. The voltage at node 207 is equal to (Vref−Vtn) where Vtn is the threshold voltage of transistor 206. Thus, with a Vtn offset, the staircase voltage of Vref is applied to inverter 208. The output of inverter 208 is therefore a square wave at the frequency of oscillator 210 with gradually increasing pulse levels. This signal (Fin) is applied to the charge pump capacitor of charge pump circuit 212. Accordingly, instead of applying an oscillating signal at full logic levels to charge pump circuit 212, it receives a square wave at its input with gradually increasing pulse levels. The charge pump output, therefore, ramps up toward its final value at a much lower rate. This rate is controlled by the shift register clock (Clk) and the amount of voltage increments in each step.

Figure 3:
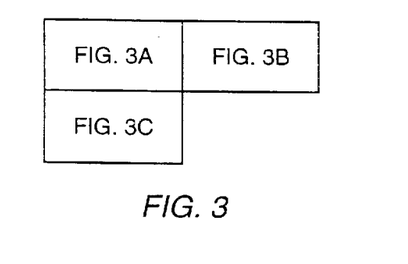
FIG. 3 is a more detailed exemplary circuit implementation of the high voltage generator circuit of FIG. 1.
Figure 3A:
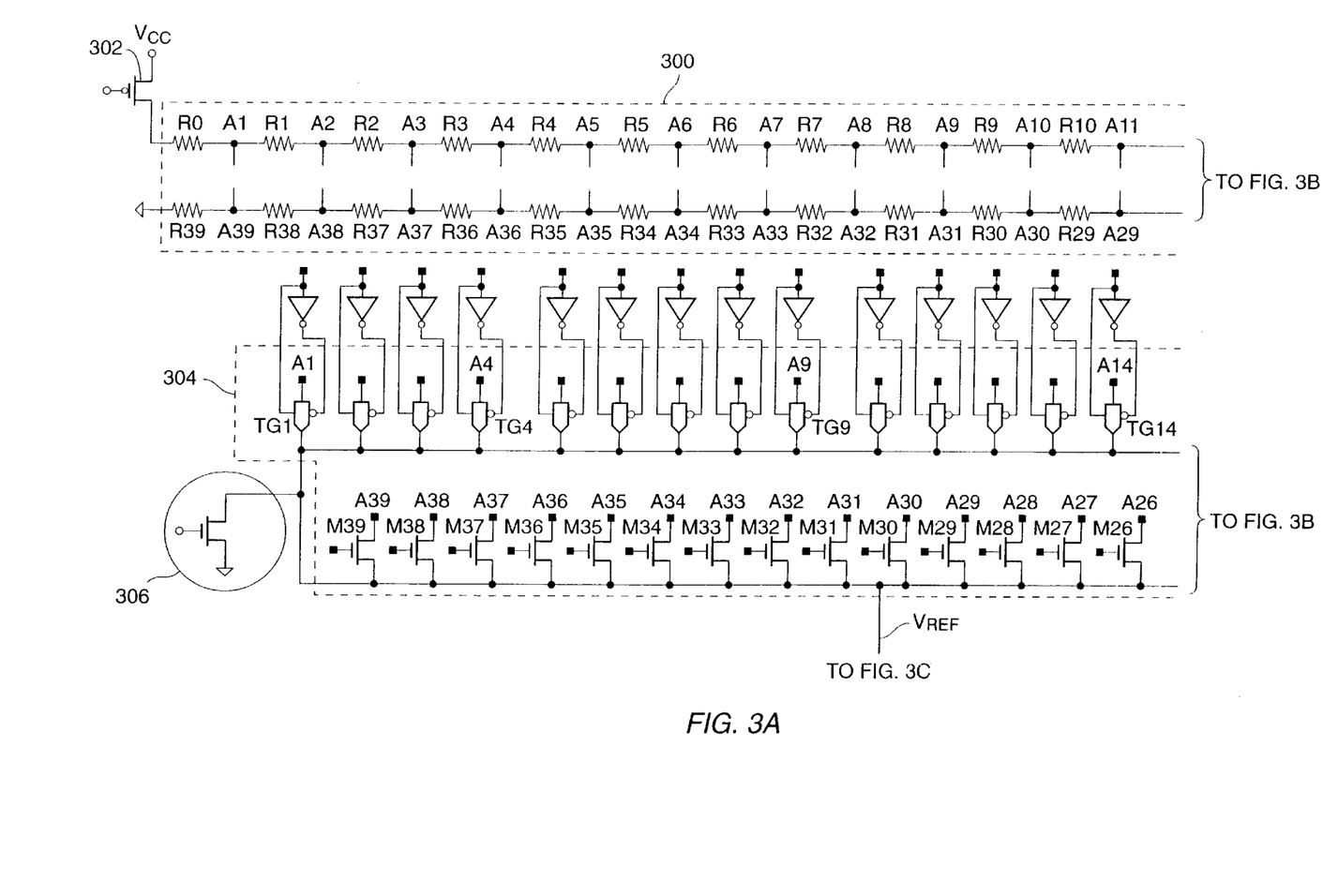
Figure 3B:
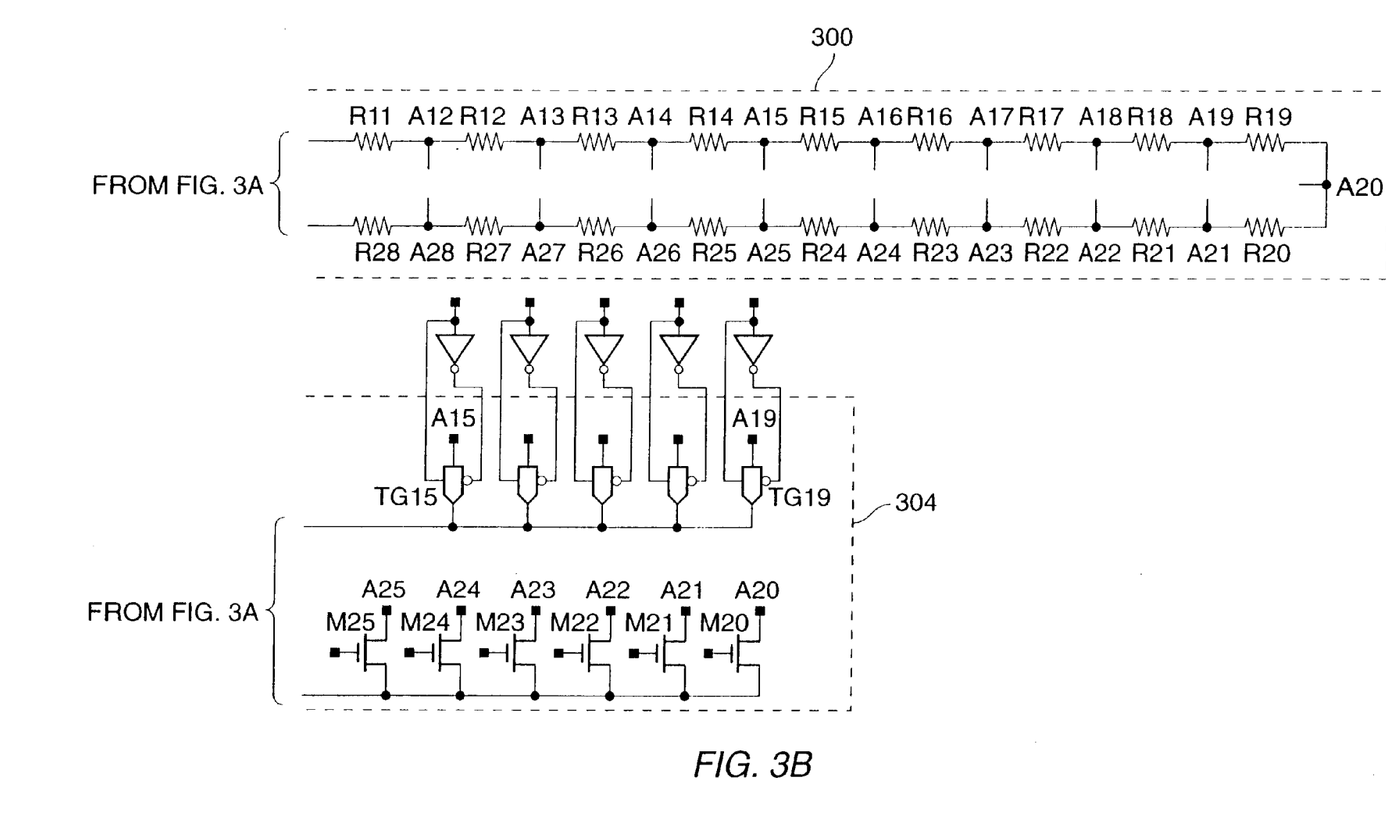
Figure 3C:
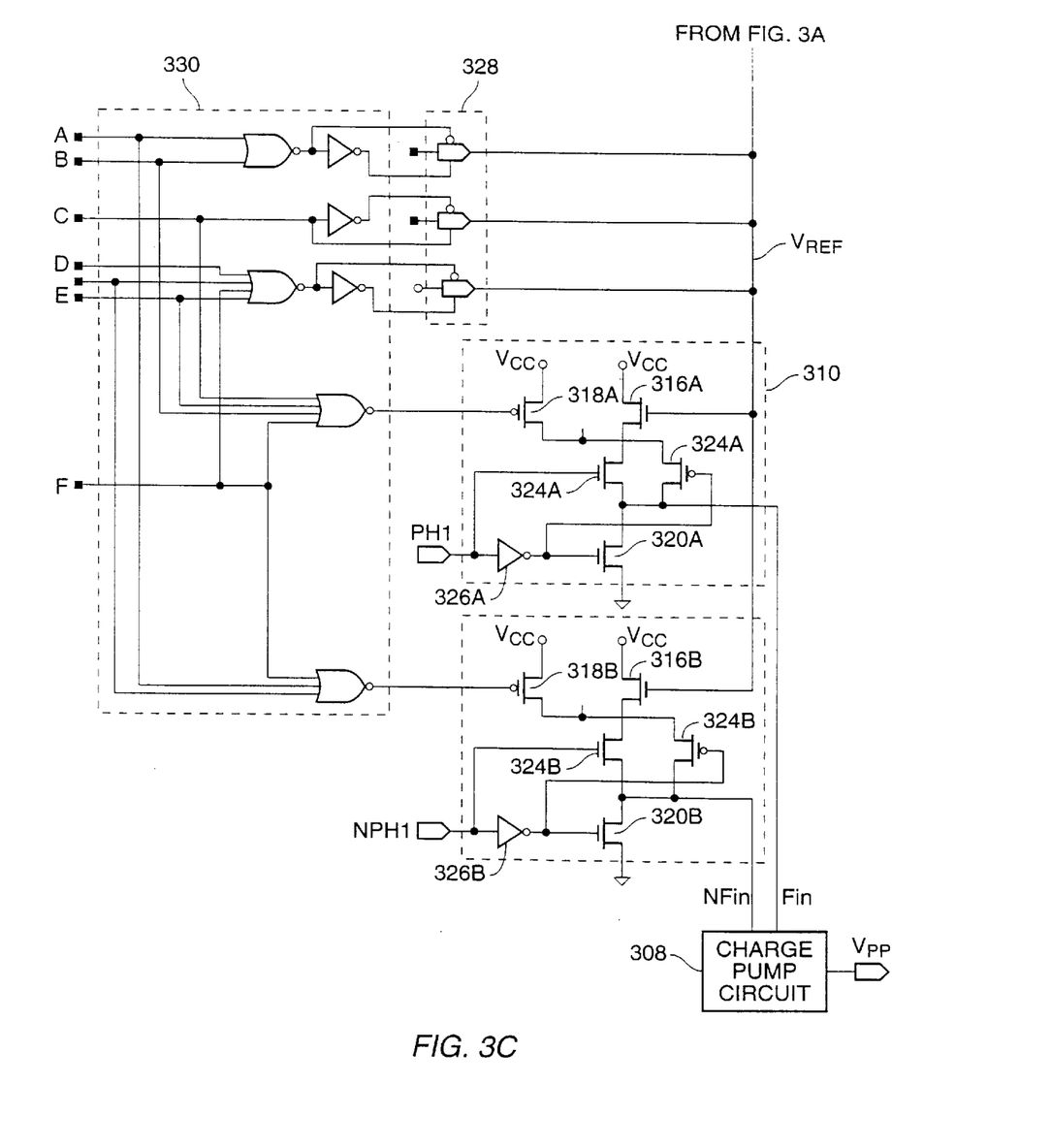

FIG. 3 shows a more detailed exemplary circuit implementation with several preferred design features. A resistor chain 300 divides the power supply voltage Vcc into 40 levels $A_0$ to $A_{39}$ going from Vcc ($A_0$) to $A_{39}$. In this exemplary embodiment, all resistors $R_0$ to $R_{38}$ are designed identically with a resistance value of R, except for the last resistor $R_{39}$ which connects to ground and whose value is a multiple of R. This results in a first step having a larger amplitude to allow for an initially fast ramp up to a selected voltage level. Since the electric field caused by a fast ramping VPP may cause damage only at higher VPP voltages, a fast initial rise to a voltage of, for example, 2.5 volts followed by a much slower ramp rate at higher voltages speeds up the charge pump operation but avoids the larger E-fields. For high accuracy, $R_{39}$ is preferably physically laid out as a multiple (e.g., 35) individual resistors of R value identical to the other resistors in the chain. To reduce standby current, a switch transistor 302 disconnects resistor chain 300 from the power supply Vcc when VPP is not required.

A bank of switches 304 connecting reference voltage levels $A_1$ through $A_{39}$ to a common node Vref is implemented using MOS transistors. In this exemplary implementation, the switches are divided into a first group of single transistor NMOS switches M39 to M20 that respectively connect the lower reference voltage levels $A_{39}$ to $A_{20}$ to Vref, and a second group of CMOS transmission gate type switches $TG_1$ to $TG_{19}$ that respectively connect the higher reference voltage levels $A_1$ through $A_{19}$ to Vref. To avoid the loss of threshold voltage (Vt) of a switch transistor, CMOS transmission gates can be used to implement all switches. This, however, requires the generation of complementary control signals for the PMOS and NMOS transistors in each transmission gate. In this embodiment, for higher reference voltage levels, CMOS transmission gates are used to eliminate the Vt loss, but at lower voltages (e.g., about 3 volts and lower), single NMOS transistor switches are used where Vt loss is no longer an issue. Thus, switches $TG_1$ to $TG_{19}$ each require an inverter to generate the complementary control signal. When VPP generation is not required (e.g., not in a programming or erase mode), a transistor 306 connects, and otherwise floating Vref node to ground. Those skilled in this art can appreciate that means other than pass transistors or transmission gates can be used to implement the bank of switches 304. For example, logic gates can be employed to perform the switching function without departing from the principles of the present invention.

The timing control circuitry is not shown in FIG. 3. A shift register similar to that shown in FIG. 2 is one example of how the control signals for switches can be generated. It is to be understood, however, that a shift register is only one example, and that there exist alternative approaches to implementing the timing control circuitry without departing from the general scope of the present invention.

In the specific embodiment shown in FIG. 3, the high voltage generator circuit uses a dual phase charge pump circuit 308 which receives at its inputs an oscillating signal Fin and its complement NFin. A first amplitude modulator 310 receives an output of an oscillator (not shown) at its input and generates Fin, and a second amplitude modulator 312 generates NFin. Each amplitude modulator includes a specialized inverter 314 that connects to Vcc via an NMOS transistor 316 as well as a PMOS transistor 318. The specialized inverter is made up of an NMOS pull down transistor 320 and a CMOS pair of pull-up transistors 322 and 324. A regular inverter 326 drives the gate terminals of NMOS 320 and PMOS 324.

As shown by the circuit schematic of FIG. 3, Vref connects to the gate terminal of NMOS transistor 316 in each amplitude modulator. In this specific embodiment, however, Vref is not only the common node of switch bank 304, it also acts as the common node for a secondary switch bank 328. Switch bank 328 includes three transmission gate switches $TG_A$, $TG_C$, and $TG_E$ that are driven by outputs of various logic gates in combinational logic block 330. An output from logic block 330 also drives the gate terminal of PMOS transistor 318 inside amplitude modulators 310 and 312. Logic block 330 is part of the timing control circuitry and its inputs are supplied by the shift register (not shown). The function of this additional logic and PMOS 318 in the modulators is to provide for a smooth transition in the amplitude as it ranges from Vcc–Vt to full Vcc. Referring back to FIG. 2, the highest voltage level that modulator transistor 206 is able to transfer to inverter 208 is Vcc–Vt. To allow for full Vcc to be applied to the inventer, the circuit of FIG. 3 adds PMOS transistor 318 in parallel to NMOS 316. However, without further refinements, instead of a steady rise in the amplitude, the last step in the ramp would be a jump from Vcc–Vt to full Vcc. The embodiment shown in FIG. 3 addresses this problem by averaging the amount of charge that is supplied to the inputs of charge pump circuit 308 to arrive at several transition levels. The averaging is accomplished by varying the amplitude of Fin and NFin at each step within this range. the following table shows one example of how the amplitude for these signals can be adjusted to yield intervening steps between Vcc–Vt and Vcc:

| STEP | Fin Amplitude | NFin Amplitude |
|------|---------------|----------------|
| #1   | [Vcc*(1/40)] – Vt | [Vcc*(1/40)] – Vt |
| #2   | [Vcc*(2/40)] – Vt | [Vcc*(2/40)] – Vt |
| #3   | [Vcc*(3/40)] – Vt | [Vcc*(3/40)] – Vt |
| #4   | [Vcc*(4/40)] – Vt | [Vcc*(4/40)] – Vt |
| .    | .             | .              |
| .    | .             | .              |
| .    | .             | .              |
| #39  | [Vcc*(39/40)] – Vt | [Vcc*(39/40)] – Vt |
| #40  | Vcc – Vt      | Vcc – Vt       |
| A    | Vcc*(38/46)   | Vcc            |
| B    | Vcc – Vt      | Vcc            |
| C    | Vcc           | Vcc*(35/40)    |
| D    | Vcc           | Vcc*(38/40)    |
| E    | Vcc           | Vcc – Vt       |
| F    | Vcc           | Vcc            |

As shown in the above table, Fin and NFin have the same amplitude up to step number 40. The amplitude is equal to the resistive divider ratio times Vcc minus one Vt, where Vt is the threshold voltage of NMOS transistor 316. At steps A through F, however, differing reference voltage levels are applied to the two modulators resulting in Fin and NFin pulses having different levels. The differing signal amplitudes operate such that the average charge applied to charge pump circuit 308 results in a VPP level that increments approximately linearly at each step from Vcc–Vt up to Vcc. Logic block 330 receives the selected reference levels and applies them to Vref and the gate terminal of PMOS 318 according to the steps shown in the above table. The values selected in the above table show only one example of how the various reference levels can be combined for a linear transition between Vcc–Vt and Vcc. One skilled in this art would be able to accomplish the same using various other combinations of the reference levels.

This embodiment of the present invention, thus, provides a process and power supply independent circuit for accurately controlling the ramp rate of the output voltage of a charge pump circuit. Instead of a 10v–15v/μsec ramp rate as is typical of conventional charge pump circuits, the present invention allows for a controlled rate of, for example, 0.01v–0.05v/μsec. This embodiment of the present invention allows for adjusting the ramp rate by the frequency of the shift register clock and/or the reference voltage step value. By adjusting the timing control circuitry and the application of selected reference levels, VPP can have a piece-wise linear ramp of any desired shape. The ramp rate can also be made programmable by, for example, programming the shift register clock frequency.

Figure 4:
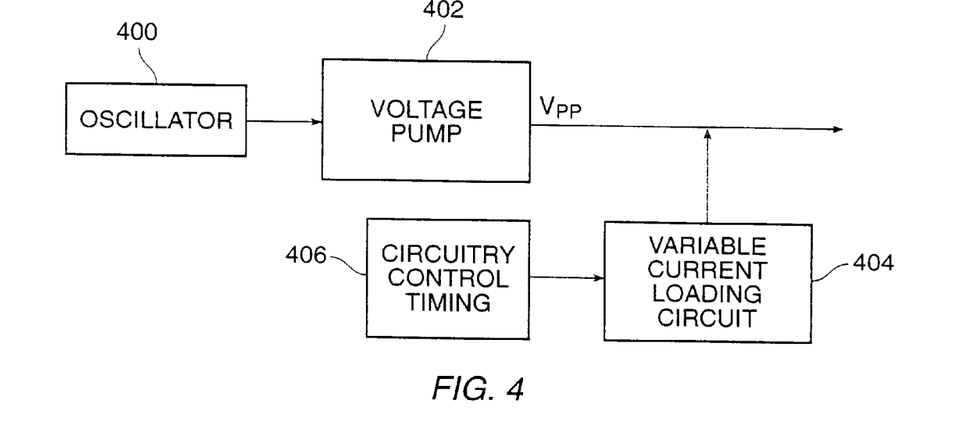
FIG. 4 is a block diagram of a high voltage generator circuit using an output loading control technique to control the output ramp rate according to a second embodiment of the present invention.

A block diagram of another embodiment of the present invention for controlling the ramp rate of the output voltage of a charge pump circuit is shown in FIG. 4. The output voltage of a charge pump circuit is directly proportional to the current loading at its output node (or VPP line). Given a constant pump output current, a gradually decreasing load on the VPP line results in a gradually increasing VPP voltage level. Referring to FIG. 4, there is shown an oscillator 400 driving a charge pump circuit 402. A variable current loading circuit 404 connects to the output of charge pump circuit 402 at VPP line. A timing control circuit 406 connects to and controls variable current loading circuit 404. According to this embodiment, timing control circuit 406 sets the VPP line current load at its maximum upon the activation of charge pump circuit 402. Thus, almost all the current that is being pumped out onto the VPP line is initially diverted away by current load circuit 404. Timing control circuit 406 gradually reduces the load by sequentially turning off current load devices inside current load circuit 404. This allows the output of charge pump circuit 402 to ramp up toward its final value at a rate that is controlled by the frequency of timing control circuit 406 and the load increments.

Figure 5:
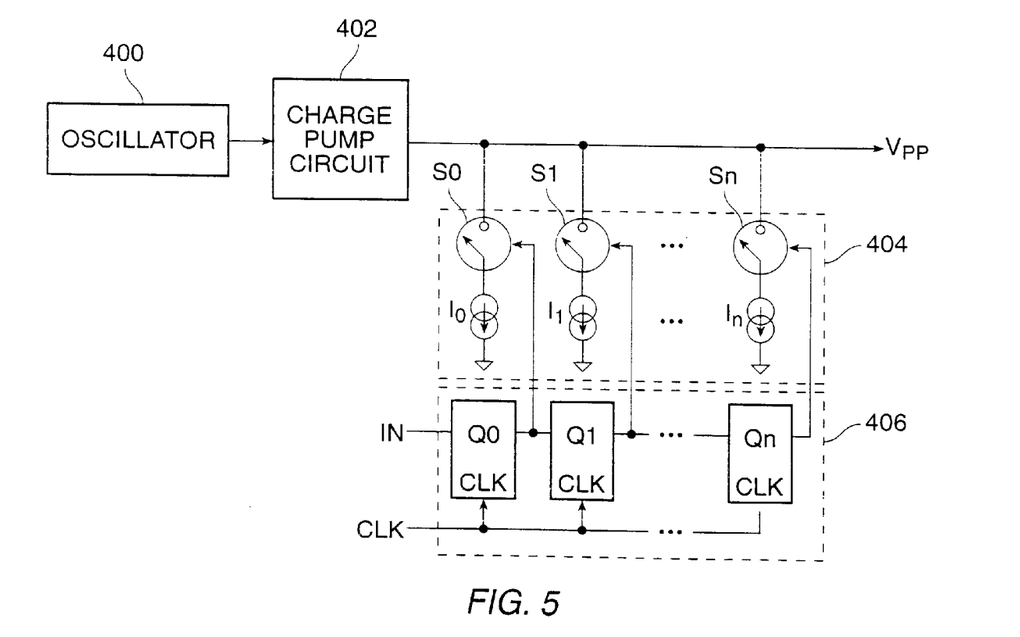
FIG. 5 is a simplified circuit schematic for an exemplary implementation of the high voltage generator circuit of FIG. 4.

One simplified exemplary circuit implementation of this embodiment is shown in FIG. 5. Variable current load circuit 404 includes multiple parallel-connected constant current source devices $I_0$ to $I_n$ that are respectively connected to VPP line via switches $S_0$ through $S_n$. Similar to the timing control circuit of the previous embodiment, timing control circuit 406 as shown in FIG. 5 is a shift register that operates in response to a clock signal Clk. In this embodiment, however, shift register 406 operates to initially turn on all switches $S_0$ to $S_n$. This causes the largest amount of pump output current to be diverted by all current source devices $I_0$ to $I_n$. Timing control circuit 406 then sequentially opens one switch at each step. Once opened, a switch remains open, disconnecting its respective current source device from the VPP line. Thus, at each step, less and less current is diverted by variable current load circuit 404. Accordingly, by using a small unit current per current source device and by controlling the frequency of the clock signal Clk for a desired time interval, the user can control the ramp rate of the voltage on the VPP line with a high degree of precision.

Figure 6:
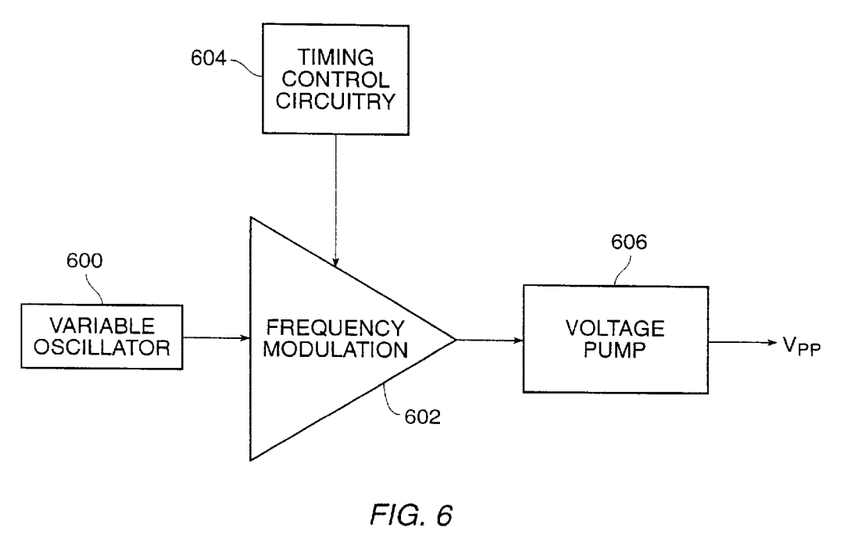
FIG. 6 is a block diagram of a high voltage generator circuit using a frequency modulation technique to control the output ramp rate according to a third embodiment of the present invention.

A third embodiment of the present invention controls the ramp rate of a charge pump output voltage VPP by modulating the frequency of the oscillator that supplies the inputs to the charge pump circuit. The ramp rate of VPP depends on the current as well as the capacitive load on the VPP line. The current drive of the charge pump circuit is directly proportional to the frequency of its input signal. Thus, by varying the frequency of the input signal to the charge pump circuit, the ramp rate of its output voltage can be controlled, specially for a heavily loaded VPP line. FIG. 6 shows a block diagram of a high voltage generator circuit according to this embodiment of the present invention. An oscillator 600 that is capable of generating variable frequencies has its output connected to a frequency modulation circuit 602. A timing control circuit 604 connects to and controls frequency modulation circuit 602. The output of frequency modulation circuit 602 drives a charge pump circuit 606.

Figure 7:
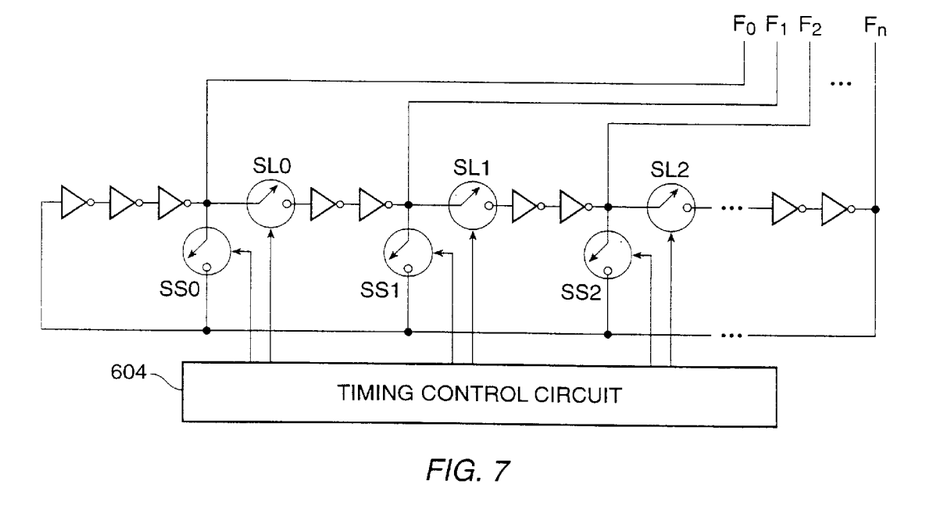
FIG. 7 is a simplified circuit schematic for an exemplary implementation of a variable frequency oscillator for use in the high voltage generator circuit of FIG. 6.

The principals of operation of the embodiment shown in FIG. 6 are similar to those of the previous embodiments. Initially, when VPP level is desired to be low, timing control circuit 604 causes frequency modulation circuit 602 to supply the lowest oscillator frequency to charge pump circuit 606, and incrementally increases the frequency thereafter. There are various methods of designing an oscillator with a variable frequency. A simple example of a variable frequency ring oscillator is shown in FIG. 7. There, multiple frequencies are made available by varying the length of the ring oscillator. The length of the ring oscillator is changed by SL and SS switches that are controlled by timing control circuit 604. Thus, by closing all SL switches and opening all SS switches, the oscillator would have its highest length resulting in the slowest frequency at Fn. By opening an SL switch and closing an SS switch, the length of the oscillator is made shorter, resulting in slightly higher frequency. Thus, by controlling the state of the SS and SL switches, the user can incrementally shorten the length of the ring oscillator and therefore its frequency. This in turn results in a well controlled ramp rate for the output of charge pump circuit 606.

It is to be understood that the frequency modulated embodiment of the present invention is not limited to the variable length ring oscillator as shown in FIG. 7. Those skilled in this art appreciate that there exist other methods of varying the frequency of a ring oscillator. For example, the capacitive loading of the oscillator impacts its frequency. Thus, programmable switches can be controlled to vary the amount of load capacitance for the oscillator, thereby modulating its frequency. Similarly, the drive capability of the inverters also impacts the frequency. Frequency modulation can thus be achieved by switches that vary the drive capability of each inverter by, for example, switching in and out parallel-connected transistors in each inverter.

In conclusion, the present invention offers various embodiments for controlling the ramp rate of a high voltage generator such as a charge pump circuit. The present invention is particularly useful in integrated circuits such as flash memories or programmable logic devices (PLDs) that use charge pump technique to generate on-chip programming voltages. While the above is a complete description of several specific embodiments of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A voltage generator control circuit comprising:
    an amplitude modulation circuit having a first input coupled to receive an input oscillating signal, and a second input coupled to receive an amplitude control signal, said amplitude modulation circuit is designed to generate at an output an oscillating signal having a modulated amplitude in response to the amplitude control signal; and
    a charge pump circuit having an input coupled to the output of the amplitude modulation circuit, and an output,
    whereby, ramp rate of a signal at the output of the charge pump circuit is controlled by the oscillating signal having a modulated amplitude.

2. The voltage generator control circuit of claim 1 wherein the amplitude modulation circuit comprises:
    a variable voltage reference generator designed to supply the amplitude control signal at an output;
    a timing control circuit coupled to the variable voltage reference generator; and
    a modulator having an amplitude control input coupled to the output of the variable voltage reference generator.

3. The voltage generator control circuit of claim 2 wherein the variable voltage reference generator comprises:
    a chain of resistive elements coupled between a power supply terminal and a ground terminal, the chain of resistive elements providing a plurality of reference voltages at a corresponding plurality of taps between pairs of resistive elements; and
    a plurality of switch elements respectively coupling the plurality of taps to a common node at the output of the variable voltage reference generator.

4. The voltage generator control circuit of claim 3 wherein the modulator comprises:
    a logic gate coupled between a first node and ground, and having an input coupled the input of the amplitude modulation circuit, and an output coupled to the output of the amplitude modulation circuit; and
    an amplitude control element coupling the first node to the power supply terminal, and having a control input coupled to the modulator amplitude control input.

5. The voltage generator control circuit of claim 3 wherein the timing control circuit comprises a shift register having a clock input, and a plurality of outputs respectively coupled to the plurality of switch elements.

6. The voltage generator control circuit of claim 3 wherein the chain of resistive elements comprises a serial chain of identically sized unit resistors, and the plurality of switch elements comprise MOS pass transistors.

7. The voltage generator control circuit of claim 4 wherein the logic gate comprises an inverter, and the amplitude control element comprises an MOS transistor.

8. The voltage generator control circuit of claim 6 wherein each switch in a first group of the plurality of switch elements comprises a single MOS pass transistor, and each switch in a second group of the plurality of switch elements comprises a CMOS transmission gate.

9. The voltage generator control circuit of claim 6 wherein the chain of resistive elements includes a serial chain of resistors wherein a first resistor coupled to the ground terminal is of larger value than the remaining resistors which are of identical value.

10. The voltage generator control circuit of claim 3 further comprising a switch element coupled between the chain of resistive elements and the power supply terminal, and a switch element coupled between the common node and the ground terminal.

11. The voltage generator control circuit of claim 4 further comprising a second modulator, the second modulator comprising:
    a logic gate having an input for receiving a second oscillating signal and an output coupled to a second input of the charge pump circuit; and an amplitude control element coupling the logic gate of the second modulator to the power supply terminal, the amplitude control element of the second modulator having a control input coupled to the modulator amplitude control input.

12. The voltage generator control circuit of claim 11 wherein the amplitude control element in each of the modulators comprises a first MOS transistor and a second MOS transistor coupling each logic gate to the power supply terminal.

13. The voltage generator control circuit of claim 12 wherein a gate terminal of the first MOS transistor in each modulator couples to the modulator amplitude control input, and a gate terminal of the second MOS transistor in each modulator couples to an output of a control logic block.

14. The voltage generator control circuit of claim 13 wherein the control logic block comprises a plurality of logic gates generating control signals for a second plurality of switch elements that couple to the common node.

15. A method for controlling the ramp rate of an output voltage of a charge pump circuit comprising the steps of:

receiving an oscillating signal;

modulating an amplitude of the oscillating signal to obtain an amplitude modulated oscillating signal in response to a control signal; and applying the amplitude modulated oscillating signal to an input of the charge pump circuit.

16. The method of claim 15 wherein the step of modulating comprises the steps of:

generating a plurality of reference voltages in predefined increments; and multiplying the plurality of reference voltages with the oscillating signal, starting from a low reference voltage and gradually incrementing to higher reference voltages at a controlled rate of time.

17. A voltage generator control circuit comprising:

a charge pump circuit having an input for receiving an oscillating signal; and a variable current loading circuit coupled to an output of the charge pump circuit and having a control input coupled to receive a current loading control signal, whereby, a ramp rate of a signal at the output of the charge pump circuit is controlled by varying a current loading at the output of the charge pump circuit in response to the current loading control signal.

18. The voltage generator control circuit of claim 17 wherein the variable current loading circuit comprises:

a plurality of current source devices coupled in parallel at the output of the charge pump circuit; and a timing control circuit having an input coupled to the control input, the timing control circuit coupled to the plurality of current source devices for controlling a state of each current source device in response to the current loading control signal.

19. The voltage generator control circuit of claim 18 wherein the plurality of current source devices comprises a respective plurality of switches, and wherein the timing control circuit comprises a serial shift register having an input coupled to receive the current loading control signal, and a plurality of outputs respectively controlling a state of the plurality of switches.

20. A voltage ramp rate control circuit comprising:

an oscillator designed to generate an oscillating signal at an output;

a variable reference voltage generator designed to generate at an output a reference voltage that varies in predefined increments in response to a control signal;

a modulator having an input coupled to receive the oscillating signal, and a control input coupled to the output of the variable reference voltage generator, wherein the modulator is designed to generate at an output an oscillating signal with modulated amplitude in response to the reference voltage; and a charge pump circuit having an input coupled to the output of the modulation circuit, and an output, whereby, ramp rate of a signal at the output of the charge pump circuit is controlled by the oscillating signal with modulated amplitude.

* * * * *